(12) United States Patent
Wood et al.

(10) Patent No.: US 6,472,739 B1
(45) Date of Patent: Oct. 29, 2002

(54) ENCAPSULATED MICROELECTROMECHANICAL (MEMS) DEVICES

(75) Inventors: Robert L. Wood, Cary; Bruce W. Dudley, Apex, both of NC (US)

(73) Assignee: JDS Uniphase Corporation, San Jose, CA (US)

(*) Notice: Subject to any disclaimer, the term of this patent is extended or adjusted under 35 U.S.C. 154(b) by 0 days.

(21) Appl. No.: 09/441,190

(22) Filed: Nov. 15, 1999

(51) Int. Cl.[7] ............................................... H01L 23/12
(52) U.S. Cl. ..................... 257/704; 257/729; 257/730; 257/788; 257/793; 174/52.2; 174/52.3
(58) Field of Search ..................... 438/15, 106, 125, 438/126, 127; 257/414, 415, 704, 787, 788, 793, 729, 730; 335/128; 174/52.2, 52.3, 52.4; 361/760

(56) References Cited

U.S. PATENT DOCUMENTS

| | | | | |
|---|---|---|---|---|
| 5,837,935 A | * | 11/1998 | Carper et al. | 174/52.4 |
| 5,909,078 A | | 6/1999 | Wood et al. | |
| 5,955,817 A | * | 9/1999 | Dhuler et al. | 310/307 |
| 5,994,161 A | * | 11/1999 | Bitko et al. | 438/53 |
| 5,994,816 A | * | 11/1999 | Dhuler et al. | 310/307 |
| 6,025,767 A | * | 2/2000 | Kellam et al. | 335/128 |
| 6,335,224 B1 | * | 1/2001 | Peterson et al. | 438/114 |
| 6,255,757 B1 | * | 7/2001 | Dhuler et al. | 310/307 |
| 6,291,922 B1 | * | 9/2001 | Dhuler et al. | 310/307 |
| 6,306,688 B1 | * | 10/2001 | Lunceford | 438/127 |
| 6,314,887 B1 | * | 11/2001 | Robinson | 102/262 |

FOREIGN PATENT DOCUMENTS

| | | | |
|---|---|---|---|
| EP | 101730 | * | 5/2002 |
| JP | 7-191117 | * | 7/1995 |

* cited by examiner

*Primary Examiner*—David L. Talbott
*Assistant Examiner*—Alonzo Chambliss
(74) *Attorney, Agent, or Firm*—Myers Bigel Sibley & Sajovec

(57) ABSTRACT

A method of encapsulating microelectromechanical (MEMS) structures is provided wherein the MEMS structures are formed on a substrate and encapsulated prior to packaging thereof. A sacrificial material is first deposited over the substrate to cover at least a portion of the MEMS structure. An encapsulation material is then deposited over the sacrificial material such that the encapsulation material covers at least a portion of the sacrificial material over the MEMS structure. The sacrificial material is subsequently removed such that the encapsulation material forms a shell spaced apart from and covering the MEMS structure and permits the intended operation of the MEMS structure. Associated MEMS devices fabricated using a method of encapsulating MEMS structures according to embodiments of the present invention are also provided.

8 Claims, 4 Drawing Sheets

ENCAPSULATED MICROELECTROMECHANICAL (MEMS) DEVICES

FIELD OF THE INVENTION

The present invention relates to microelectromechanical devices and associated fabrication methods and, more particularly, to an encapsulation process for microelectromechanical structures and associated microelectromechanical devices.

BACKGROUND OF THE INVENTION

Microelectromechanical structures (MEMS) and other microengineered devices are presently being developed for a wide variety of applications in view of the size, cost and reliability advantages provided by these devices. Many different varieties of MEMS devices have been created, including microgears, micromotors, and other micromachined devices that are capable of motion or applying mechanical force. These MEMS devices can be employed in a variety of applications including hydraulic applications in which MEMS pumps or valves are utilized, optical applications which include MEMS light valves and shutters, and electrical applications which include MEMS relays.

MEMS devices have relied upon various techniques to provide the force necessary to cause the desired mechanical motion within these microstructures. For example, electrostatic actuators have been used to actuate MEMS devices. See, for example, U.S. patent application Ser. No. 09/320,891, assigned to MCNC, also the assignee of the present invention, which describes MEMS devices having electrostatic microactuators, the contents of which are incorporated herein by reference. In addition, controlled thermal expansion of an actuator or other MEMS component is another example of a technique for providing the necessary force to cause the desired mechanical motion within MEMS devices. See, for example, U. S. Pat. No. 5,909,078 and U.S. patent application Ser. Nos. 08/936,598; and 08/965,277, assigned to MCNC, also the assignee of the present invention, which describe MEMS devices having thermally actuated microactuators, the contents of which are incorporated herein by reference.

Once a MEMS device has been fabricated, the entire device must undergo subsequent packaging steps to process the MEMS device into a usable form. These packaging steps may include, for instance, wafer dicing, assembly, wire bonding, and encapsulation processes. A typical MEMS device is unlikely to survive these packaging steps due to the extensive manipulation of the device during the individual processes. Since the actuators used in MEMS devices incorporate mechanical motion to achieve the desired function of the particular MEMS device and since a MEMS device may include additional mechanically sensitive components, MEMS devices generally present a particularly challenging packaging problem.

Conventional integrated circuit encapsulation packaging is typically a conformal surface coating. However, conformal coatings are not particularly suited to packaging a MEMS device since it difficult to provide the necessary clearances about the mechanically sensitive components of the MEMS device.

Another approach to packaging MEMS devices has been to fabricate a separate "lid" structure which is then bonded to the MEMS die prior to packaging. However, a disadvantage of the separate lid approach is that, when the lid is bonded to the die at the wafer level, the entire MEMS die is covered, thereby preventing physical or electrical access to the MEMS die in subsequent packaging processes.

Thus, there exists a need for an encapsulation process for a MEMS device which is compatible with and capable of protecting the mechanically sensitive components of a MEMS device during subsequent packaging steps. Preferably, the encapsulation process for a MEMS device utilizes conventional semiconductor fabrication techniques and equipment such that special measures are not required. Further, the encapsulation process is desirably capable of selectively encapsulating portions of the MEMS device while leaving other portions free of the encapsulant which, for example, do not require encapsulation or which must be externally accessible in subsequent packaging processes. In addition, the encapsulation process for a MEMS device is preferably cost-efficient and allows conventional low-cost packaging techniques to be used following encapsulation of the MEMS device.

SUMMARY OF THE INVENTION

The above and other needs are met by the present invention which, in one embodiment, provides a method of encapsulating microelectromechanical (MEMS) structures formed on a substrate prior to packaging thereof. First, a sacrificial material is deposited over the substrate to cover at least a portion of the MEMS structure. An encapsulation material is then deposited over the sacrificial material such that the encapsulation material covers at least a portion of the sacrificial material over the MEMS structure. The sacrificial material is subsequently removed such that the encapsulation material forms a shell spaced apart from and covering the MEMS structure and permits the intended operation of the MEMS structure.

According to another advantageous embodiment of the present invention, the step of depositing a sacrificial material may further comprise depositing a removable photoresist on the substrate to cover at least a portion of the MEMS structure where, in some cases, the photoresist completely covers the MEMS structure. Further, a method of encapsulating MEMS structures may include the step of forming a pattern associated with the sacrificial material to selectively define regions of the MEMS structure that are covered during subsequent operations. The sacrificial material may also define regions of the MEMS structure that are to be protected by the encapsulation material.

Advantageous embodiments of the present invention also include the step of defining at least one opening in the sacrificial material following deposition thereof for exposing a portion of the substrate, the exposed portion of the substrate comprising, for example, an anchor point. In addition, the step of depositing an encapsulation material may further comprise depositing an encapsulation material over the sacrificial material such that the sacrificial material engages the MEMS substrate at an exposed portion thereof, wherein the encapsulation material may comprise, for example, a photoimagable epoxy having a sufficient thickness to form an encapsulating shell about the MEMS structure. After the encapsulation material has been deposited on the sacrificial layer, at least one opening in the encapsulation material is then defined to expose a portion of the sacrificial material. Some embodiments of a method for encapsulating MEMS structures include the step of forming a pattern associated with the encapsulation material to selectively define regions of the MEMS structure that are covered by the encapsulation material during subsequent operations.

Generally, the step of depositing an encapsulation material comprises depositing an encapsulation material over the sacrificial material after the sacrificial material has been patterned and portions thereof removed.

In some instances, the step of removing the sacrificial material may further comprise removing the sacrificial material such that the encapsulation material forms a shell spaced apart from and covering at least a portion of the MEMS structure such that the intended operation of the MEMS structure is permitted, wherein the sacrificial material is generally removed from areas of the MEMS structure that are not desired to be in contact with the encapsulation material. In addition, the step of removing the sacrificial material may further comprise removing the sacrificial material from portions of the MEMS structure that are to be externally accessible following the deposition of the encapsulation material. Prior to the step of removing the sacrificial material, embodiments of a method of encapsulating MEMS structures include the step of selectively insolubilizing the encapsulation material to make it more durable and impervious to subsequent processing steps. Thus, a method of encapsulating MEMS structures formed on a substrate prior to packaging thereof generally comprises the step of depositing an encapsulation material over the MEMS structure such that the encapsulation material forms a shell spaced apart from and covering the MEMS structure, thereby permitting the intended operation of the MEMS structure.

Another advantageous aspect of the present invention comprises an encapsulated MEMS structure having a microelectronic substrate with at least one MEMS structure formed thereon and an encapsulating cover connected to the substrate and forming a shell over at least a portion of the MEMS structure such that the intended operation of the MEMS structure is permitted. The substrate may further define anchor points for the cover where the anchor points are fixed in location and the encapsulating cover generally comprises vertical supports and generally horizontal segments. In some instances, the encapsulating cover comprises a shell having supports connected to the microelectronic substrate at the anchor points. Additionally, the encapsulating cover may define access zones where access may be gained to the MEMS structure underneath the shell. The encapsulating cover may be formed of an epoxy material and, more specifically, for example, a photolithographically patternable material that is microelectromechanically fabricated.

A further aspect of the present invention comprises an intermediate MEMS structure having a microelectronic substrate with at least one MEMS structure formed thereon, a sacrificial layer over the substrate that covers at least a portion of the MEMS structure, and an encapsulating layer over the sacrificial layer that covers at least a portion of the sacrificial layer over the MEMS structure and is connected to the microelectronic substrate. Preferably, the microelectronic substrate defines fixed anchor points for the encapsulating layer, wherein the encapsulating layer comprises a shell having supports connected to the microelectronic substrate at the anchor points. The encapsulating layer is preferably comprised of an epoxy material such as, for example, a photolithographically patternable material that is microelectromechanically fabricated.

Still another advantageous aspect of the present invention comprises a system having an operational device that incorporates a MEMS structure, an input to the MEMS structure, a MEMS structure having an encapsulating cover forming a shell over at least a portion of the MEMS structure and spaced apart therefrom such that the intended operation of the MEMS structure as permitted, and an output from the encapsulated MEMS structure. Preferably, the input originates at least in part from the operational device and the output is provided at least in part to the operational device. Such an operational device may comprise, for example, a high voltage switch, a gyroscope, and an inertia sensor. More generally, the operational device may be capable of, for instance, directing light and controlling airflow.

Thus, embodiments of the present invention provide an encapsulation process for a MEMS device which is compatible with, and capable of protecting, the mechanically sensitive components of a MEMS device during subsequent packaging steps. As described herein, the encapsulation process for a MEMS device according to the present invention utilizes conventional semiconductor fabrication techniques and equipment and is capable of selectively encapsulating portions of the MEMS device while leaving other portions free of the encapsulant which, for example, do not require encapsulation or which must be externally accessible in subsequent packaging processes. Further, the encapsulation process according to the present invention is cost-efficient and allows conventional low cost packaging techniques to be used following encapsulation of the MEMS device.

BRIEF DESCRIPTION OF THE DRAWINGS

Some of the advantages of the present invention having been stated, others will appear as the description proceeds, when considered in conjunction with the accompanying drawings, which are not necessarily drawn to scale, in which.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1B:
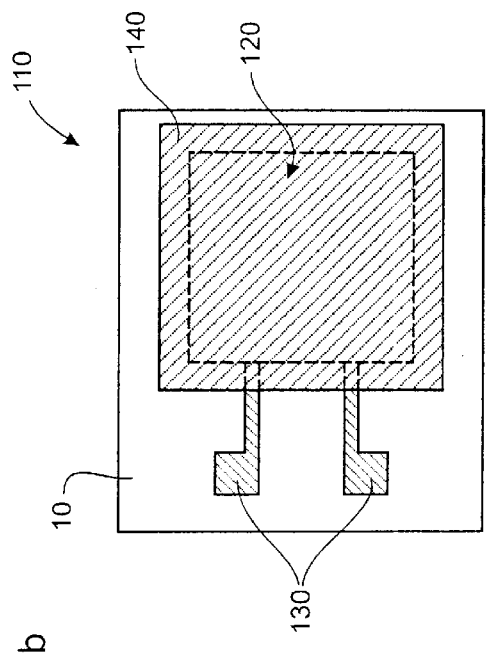
FIGS. 1A–1D are schematic plan views of a processing sequence for encapsulating a MEMS device according to one embodiment of the present invention.
Figure 1D:
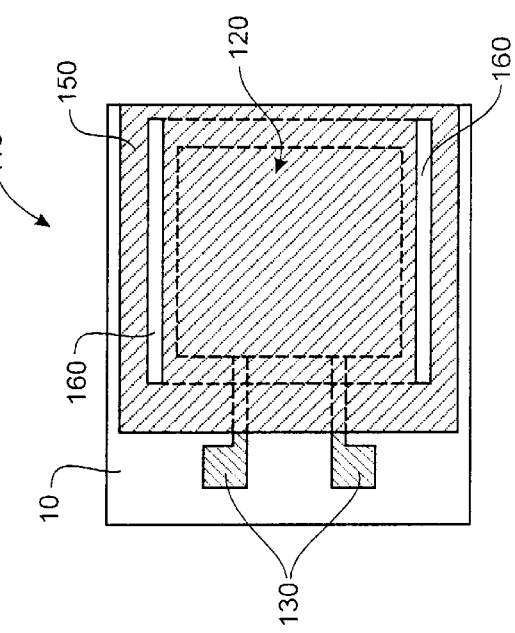
Figure 1A:
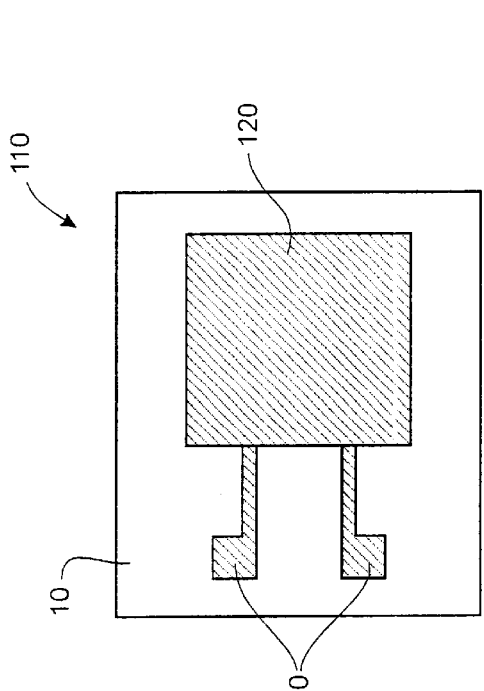

FIGS. 1A–1D schematically illustrate a processing sequence for encapsulating a MEMS device according to one embodiment of the present invention. MEMS devices are typically formed on a suitable substrate 10 such as, for example, a silicon wafer, using known processes. Due to the size of individual MEMS devices, multiple MEMS devices are often formed on a single silicon wafer, wherein each individual MEMS device and accompanying structures, if any, are collectively referred to as a die and indicated generally by the numeral 110. FIG. 1A shows a single die 110 having a MEMS device 120 formed thereon. The die 110 may further include metallic structures 130 such as, for instance, bond pads 130 formed on the substrate 10 and operably connected to the MEMS device 120. The bond pads 130 permit electrical connections to the MEMS device 120 which are necessary for the operation thereof. Typically, the physical electrical connections to the bond pads 130 are formed following packaging and incorporation of the MEMS device 120 into a final operational structure. In some instances, further access to the MEMS device 120 may be required during or after subsequent downstream fabrication processes.

FIG. 1B illustrates a sacrificial layer 140 deposited on the MEMS device 120. The sacrificial layer 140 preferably covers at least a portion of the MEMS structure 120 and is comprised of, for example, a removable photoresist such as AZ4620 made by Hoechst Celanese. In some cases, the sacrificial material 140 may completely cover the MEMS structure 120 or the entire die 110. In some embodiments of the present invention, the sacrificial material 140 may then be patterned to selectively define regions of the MEMS structure 120 that are covered by the sacrificial material 140 during subsequent operations. The sacrificial material 140 may also define regions of the MEMS structure 120 which will require further protection. As shown in FIG. 1B, in some instances the sacrificial layer 140 is deposited such that it covers the MEMS device 120 while leaving the bond pads 130 and portions of the substrate exposed on the die 110.

Figure 1C:
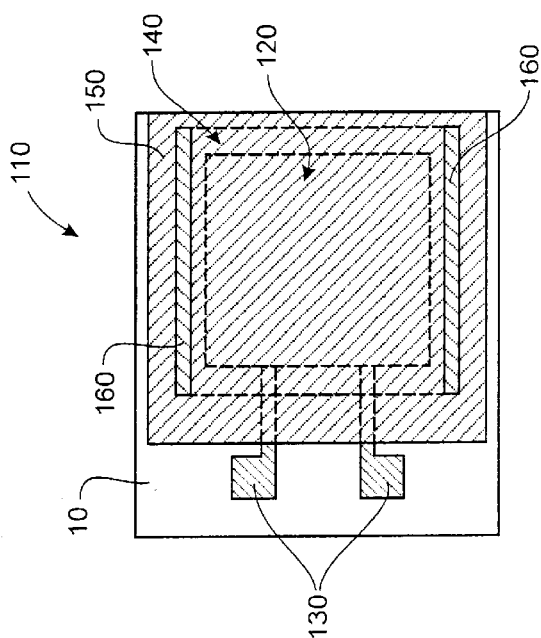

As shown in FIG. 1C, an encapsulation layer 150 is then deposited over the sacrificial material 140 such that the encapsulation material 150 covers at least a portion of the sacrificial material 140 over the MEMS structure 120. Preferably, the encapsulation layer 150 contacts portions of the substrate and/or the MEMS device 120 in order to secure the encapsulation layer 150 to the die 110. The encapsulation layer 150 may comprise, for example, a photoimagable epoxy capable of being insolubilized, such as SU-8 made by Microlithography Chemical Corp. Once the encapsulation layer 150 has been deposited on the MEMS die 110, the encapsulation layer 150 is patterned using known photolithographic and/or etching techniques to define the portions of the encapsulation layer 150 that will remain on the MEMS die 110. The encapsulation layer 150 is generally patterned such that the bond pads 130 are exposed for subsequent electrical connection thereto. Preferably, the encapsulation material 150 is patterned to expose at least a portion of the sacrificial material 140 through at least one opening 160 defined by the encapsulation layer 150. In a particularly advantageous embodiment of the present invention, the encapsulation layer 150 is patterned to selectively define regions of the MEMS device 120 that are to be covered by the encapsulation layer 150 during subsequent operations. The encapsulation layer 150 is then insolubilized by, for example, exposure to UV light followed by baking and, as shown in FIG. 1D, the sacrificial material 140 then etched away through the openings 160 by, for example, a wet etching process. Accordingly, the encapsulation layer 150 forms a shell spaced apart from and covering at least a portion of the MEMS device 120 such that the intended operation of the MEMS device 120 is permitted. Thus, the sacrificial material 140 is generally removed from areas of the MEMS device 120 that are not desired to be in contact with the encapsulation material 150. In some instances, the sacrificial material 140 is removed from portions of the MEMS device 120 that are to be externally accessible following deposition of the encapsulation layer 150. Once the encapsulation of the MEMS device 120 is completed, the silicon wafer 10 is then ready for dicing to separate the individual die 110. The individual die 110 can then be packaged and formed into a final operational device.

Figure 2:
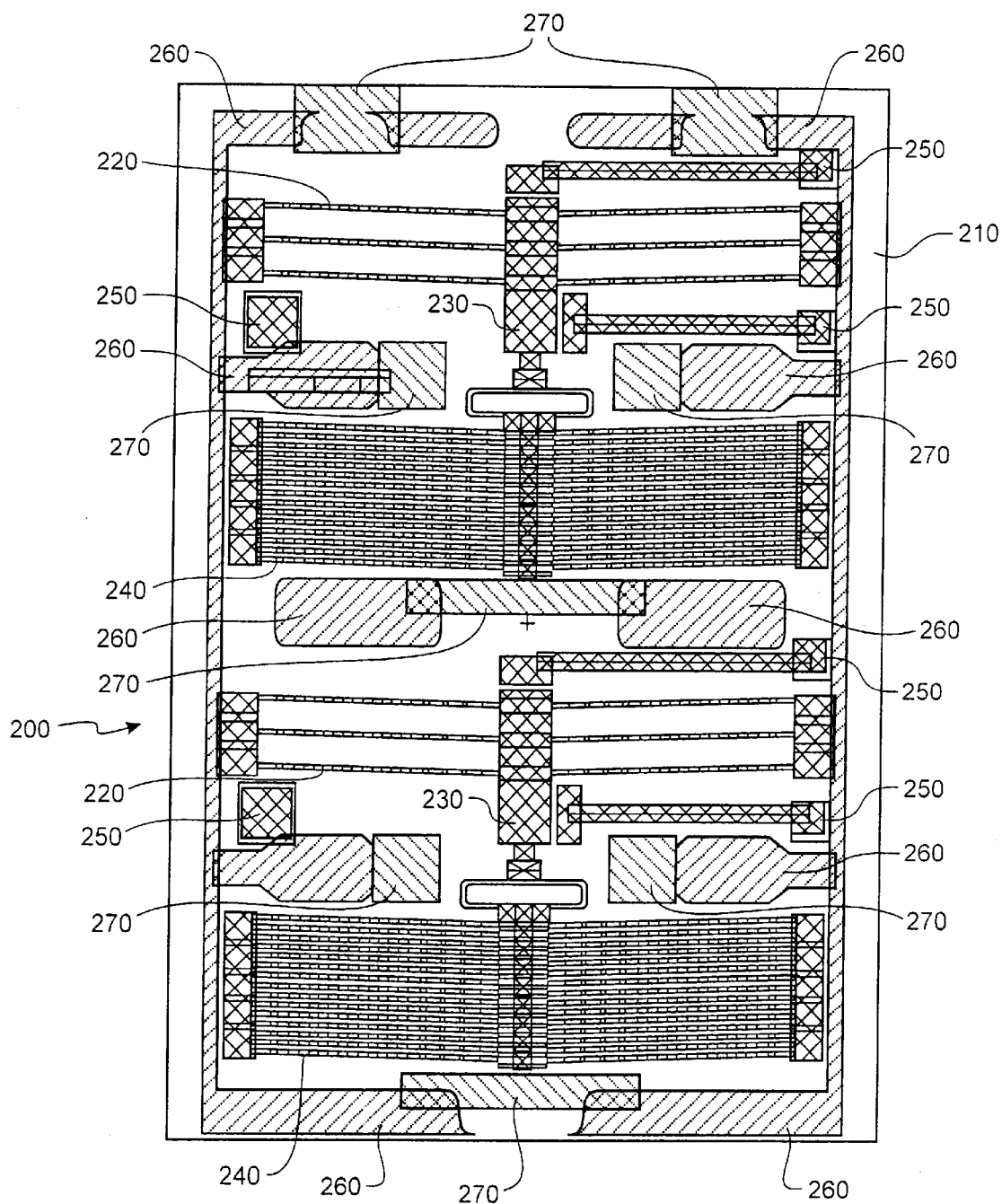
FIG. 2 is a plan view of an example of an encapsulated MEMS microrelay according to one embodiment of the present invention.

FIG. 2 shows a plan view of an encapsulated MEMS device configured as a microrelay 200. The MEMS microrelay 200 is typically formed on a substrate 210 and comprises, for example, an active actuator 220, a relay structure 230, and a passive actuator 240. In some cases, the structures forming the microrelay 200 further include associated bond pads 250 at which the necessary electrical connections to the structures are established. The bonding pads 250 may form, for example, electrical contact points providing the necessary electrical power for the active actuator 220 or the connections to the relay structure 230. Typically, the operation of a MEMS device, such as the MEMS microrelay 200 described, requires mechanical motion of components of the microrelay 200 for the device to operate as intended. Further details regarding the operation of a MEMS device, such as a microrelay, may be found in, for example, U.S. patent application Ser. Nos. 09/383,053 and 09/388,321 assigned to MCNC, also the assignee of the present invention.

Figure 3A:
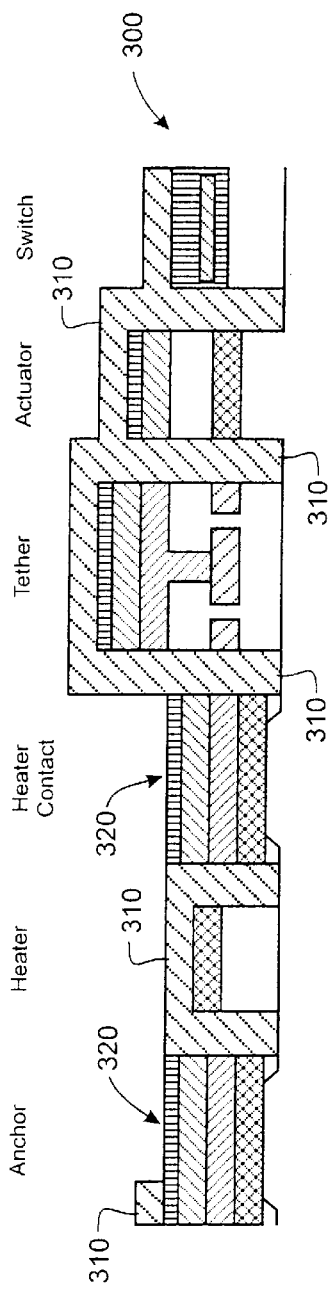
FIGS. 3A–3C are cross-sectional views of a processing sequence for encapsulating an example or a MEMS device according to one embodiment of the present invention.
Figure 3B:
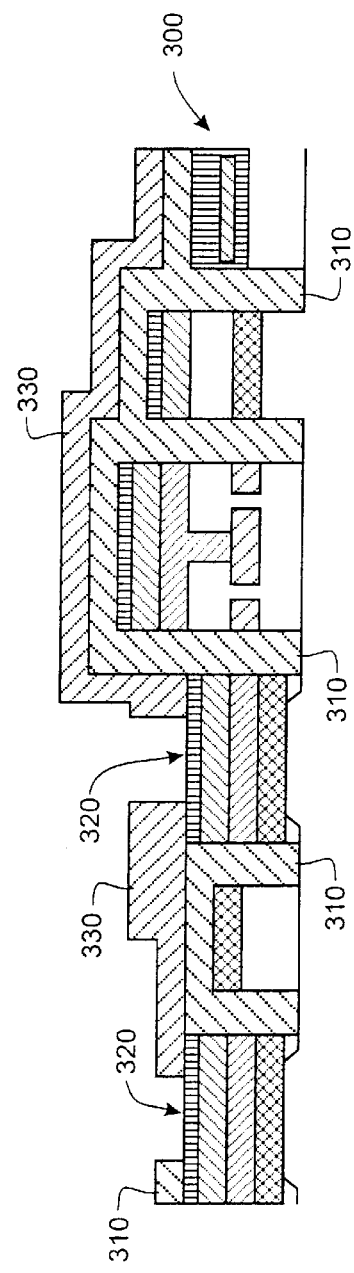
Figure 3C:
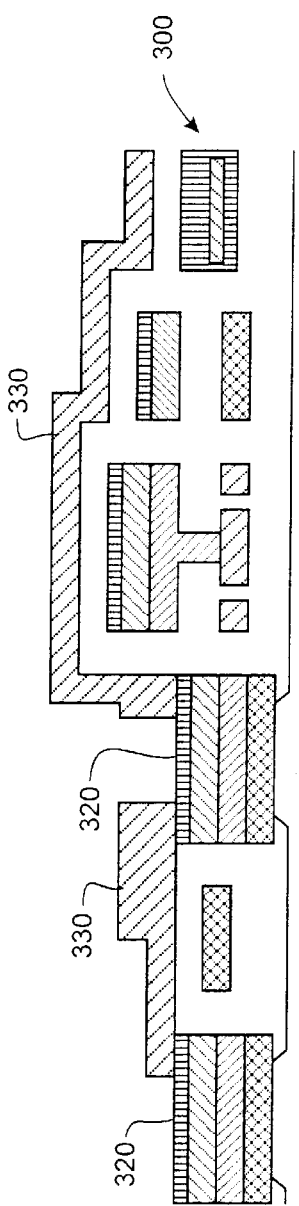

In order for a MEMS device, such as the microrelay 200, to be incorporated into a final operational device, the microrelay 200 must be packaged to protect the device while selectively permitting access thereto for establishing the necessary electrical connections. A processing sequence for encapsulating a MEMS device according to one embodiment of the present invention is thus shown in FIG. 3. As shown in FIG. 3A, a sacrificial material 310, such as a removable photoresist, is first applied to a representative MEMS device 300. The sacrificial material 310 is then patterned to selectively define portions of the sacrificial material 310 to be subsequently removed in order to establish access to certain portions of the MEMS device 300. Such access areas may comprise, for example, bond pads 320 for electrical connections or anchor areas 260 (as shown in FIG. 2) for subsequent layers. The sacrificial material 310 is then etched to form the desired structure. As shown in FIG. 3B, an encapsulation material 330 such as, for example, a photoimagable epoxy, is deposited over portions of the MEMS device 300 after the sacrificial material 310 is patterned. The encapsulation material 330 is then patterned to define areas of the encapsulation material 330 to be subsequently removed in order to provide access to underlying structures. For example, the encapsulation material 330 may be removed over the areas comprising the bond pads 320 to gain access thereto for electrical connections and/or over selected portions of the sacrificial material 310 (shown as access ports 270 in FIG. 2) for access thereto in later processes. The encapsulation material 330 is then etched to form the desired structure. The encapsulation material 330 is then insolubilized, for instance, by a photoimaging process. Following insolubilization of the encapsulation material 330, the encapsulated MEMS device 300 is subjected to a process for removing the sacrificial material 310 such as, for example, a wet etching process. The access ports 270 (as shown in FIG. 2) permit the etch to attack the sacrificial material 310 underlying the insolubilized encapsulation material 330, thereby removing the sacrificial material 310. In a particularly advantageous embodiment, the sacrificial material 310 is removed from mechanically moveable components of the MEMS device 300. Thus, as shown in FIG. 3C, a hard shell of the encapsulation material 330 remains over selected portions of the MEMS device 300 following removal of the sacrificial material 310 and allows access to critical portions of the MEMS device 300, such as the bond pads 320. The hard shell of the encapsulation material 330 is affixed to the MEMS device 300 at the anchor areas 260 (as shown in FIG. 2) and is spaced apart from the mechanically moveable portions of the MEMS device 300 so as to allow unhindered mechanical movement thereof Once the process is completed, the resulting MEMS device 300 is encapsulated in such a manner that subsequent packaging steps may then be undertaken to produce a final operational device, wherein the mechanically moveable or other sensitive portions of the MEMS device 300 are covered and protected by the hard shell of the encapsulation material 330. The encapsulated MEMS device may also be incorporated into a system having an input to and output from the MEMS device.

Figure 4:
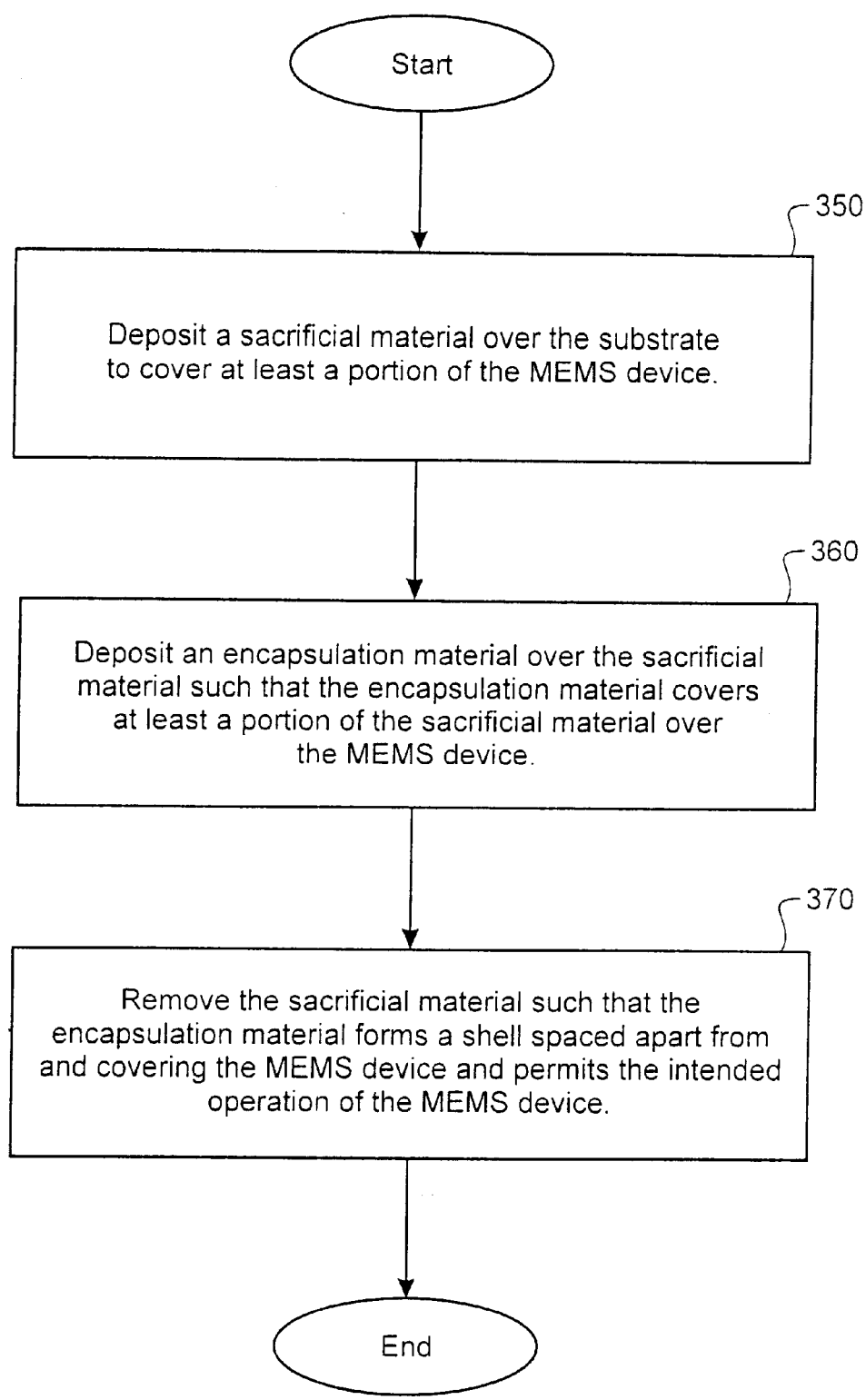
FIG. 4 is a flowchart of a method of encapsulating a MEMS device according to one embodiment of the present invention.

A further advantageous aspect of the present invention comprises a method of encapsulating MEMS devices, generally formed on a substrate and prior to packaging thereof, as shown in FIG. 4. First, a sacrificial material is deposited over the substrate to cover at least a portion of the MEMS device (block 350). The sacrificial material may comprise, for example, a removable photoresist. In some instances, the sacrificial material may completely cover the MEMS device. Thereafter, the method of encapsulating a MEMS device may further include the step of forming a pattern associated with the sacrificial material to selectively define regions of the MEMS device that are covered by the sacrificial material during subsequent operations, wherein these regions may include portions of the MEMS device to be protected by the encapsulation material. Generally, at least one opening in the sacrificial material is defined wherein the opening exposes at least a portion of the substrate. The exposed portion of the substrate may be used for, for example, an anchor point for subsequent layers.

An encapsulation material is then deposited over the sacrificial material such that the encapsulation material covers at least a portion of the sacrificial material over the MEMS device (block 360). Preferably, the encapsulation material engages the substrate at an exposed portion thereof, such as an anchor point, and may comprise, for example, a photoimagable epoxy. The encapsulation material is generally deposited with a sufficient thickness to form an encapsulating shell about the MEMS device, wherein the encapsulation material may be further processed to define at least one opening therethrough exposing a portion of the sacrificial material. Patterning of the encapsulation material selectively defines regions of the MEMS device that are covered by the encapsulation material during subsequent operations. Also, the encapsulation material may be selectively removed from areas where access is to be gained to the MEMS device. The sacrificial material is then removed such that the encapsulation material forms a shell, spaced apart from and covering the MEMS device, and permits the intended operation of the MEMS device (block 370). Generally, the sacrificial material is removed from areas of the MEMS device that are not to be in contact with the encapsulation material. In some instances, the sacrificial material is removed from portions of the MEMS device that are to be externally accessible following deposition of the encapsulation material. Generally, the encapsulation material is insolubilized prior to removing the sacrificial material from the MEMS device.

Thus, embodiments of the present invention provide an encapsulation process for a MEMS device that is compatible with, and is capable of protecting, the mechanically moveable and sensitive components of a MEMS device during subsequent packaging steps. The encapsulation process for a MEMS device according to embodiments of the present invention utilizes conventional semiconductor fabrication techniques and equipment. Such a process is capable of selectively encapsulating portions of the MEMS device while leaving other portions free of the encapsulant which, for example, do not require encapsulation or which must be externally accessible in subsequent packaging processes. These factors combine to provide an encapsulation process that is cost-efficient and allows conventional low cost packaging techniques to be used following encapsulation of the MEMS device.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An intermediate microelectromechanical (MEMS) device including a movable portion comprising:
   a microelectronic substrate having at least one MEMS device thereon;
   a sacrificial layer over the substrate that is directly on the movable portion of the MEMS device; and
   an encapsulating layer that is formed of an epoxy material and that is connected to the sacrificial layer that is directly on the movable portion of the sacrificial layer over the MEMS device and is connected to the microelectronic substrate.

2. An intermediate MEMS device according to claim 1 wherein the microelectronic substrate defines anchor points for the encapsulating layer, the anchor points being fixed in location.

3. An intermediate MEMS device according to claim 2 wherein said encapsulating layer comprises a shell having supports connected to the microelectronic substrate at the anchor points.

4. An intermediate MEMS device according to claim 1 wherein the encapsulating layer is comprised of an epoxy material.

5. An intermediate MEMS device according to claim 1 in combination with an operational device that is connected thereto, wherein the MEMS device includes an input that is configured to be responsive to the operational device, and an output that is configured to be supplied to the operational device.

6. An intermediate MEMS device according to claim 5, wherein the operational device comprises at least one of the high voltage switch, a gyroscope and an inertia sensor.

7. An intermediate MEMS device according to claim 5, wherein the operational device is configured to at least one of directing light and controlling air flow.

8. An intermediate MEMS device according to claim 1 wherein the sacrificial layer is sufficiently thick between the movable portion of the MEMS device and the encapsulating layer that is adjacent thereto, such that the MEMS device moves without interference from the encapsulating layer upon removal of the sacrificial layer between the MEMS device and the encapsulating layer that is adjacent thereto.

* * * * *